United States Patent
Weijers

(10) Patent No.: US 7,758,221 B2
(45) Date of Patent: Jul. 20, 2010

(54) VEHICLE HEADLIGHT

(75) Inventor: Aldegonda Lucia Weijers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/298,960

(22) PCT Filed: Apr. 25, 2007

(86) PCT No.: PCT/IB2007/051529

§ 371 (c)(1),
(2), (4) Date: Oct. 29, 2008

(87) PCT Pub. No.: WO2007/125485

PCT Pub. Date: Nov. 8, 2007

(65) Prior Publication Data

US 2009/0103321 A1    Apr. 23, 2009

(30) Foreign Application Priority Data

May 2, 2006    (EP)    .................................. 06113379

(51) Int. Cl.
*F21V 33/00* (2006.01)

(52) U.S. Cl. .......................... 362/545; 362/84; 362/507; 362/516

(58) Field of Classification Search .................. 362/84, 362/545, 507, 509, 516
See application file for complete search history.

(56) References Cited

U.S. PATENT DOCUMENTS

| 6,406,172 | B1 | 6/2002 | Harbers et al. |
| 6,601,982 | B1 | 8/2003 | Begemann et al. |
| 2004/0027062 | A1 | 2/2004 | Shiang et al. |
| 2004/0145308 | A1 | 7/2004 | Rossner et al. |
| 2004/0211970 | A1 | 10/2004 | Hayashimoto et al. |
| 2005/0269582 | A1 | 12/2005 | Mueller et al. |
| 2007/0012928 | A1 * | 1/2007 | Peng et al. ..................... 257/79 |
| 2007/0046169 | A1 * | 3/2007 | Maeda et al. ................ 313/487 |
| 2007/0114551 | A1 * | 5/2007 | Kawaguchi et al. ........... 257/98 |
| 2007/0139920 | A1 * | 6/2007 | Van De Ven et al. ........ 362/235 |
| 2007/0252513 | A1 * | 11/2007 | Justel et al. .................. 313/503 |

FOREIGN PATENT DOCUMENTS

| EP | 1213773 A1 | 6/2002 |
| EP | 1385216 A2 | 1/2004 |
| EP | 1418628 A1 | 5/2004 |
| JP | 2004119634 A | 4/2004 |
| WO | 2005107420 A | 11/2005 |
| WO | 2007017122 A | 2/2007 |

* cited by examiner

Primary Examiner—Laura Tso

(57) ABSTRACT

The present invention relates to a headlight (10) for a vehicle. The headlight comprises a light emitting diode (LED) (12) including at least one LED chip (18) adapted to emit blue light and at least one overlying converter layer (20) for converting part of the blue light into yellow light, wherein part of the blue and yellow light forms bluish white light emitted in the direction of the LED normal and part of the blue and yellow light forms yellowish white light emitted at larger angles of departure, and means (14, 16) for directing at least part of the yellowish white light in a central direction of the headlight and at least part of the bluish white light in a peripheral direction of the headlight. The present invention also relates to a vehicle comprising such a headlight.

20 Claims, 1 Drawing Sheet

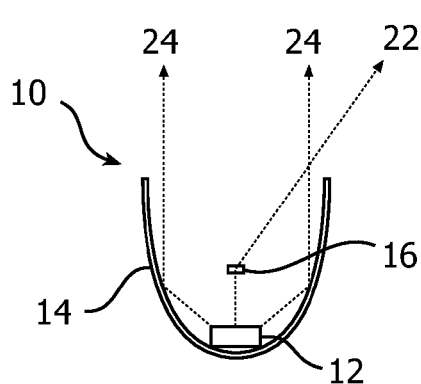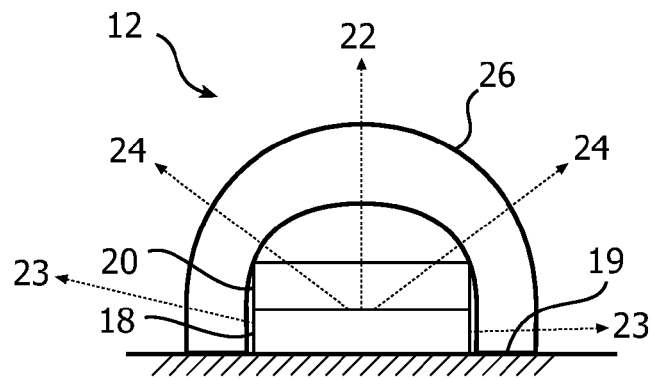
FIG. 1　　　FIG. 2
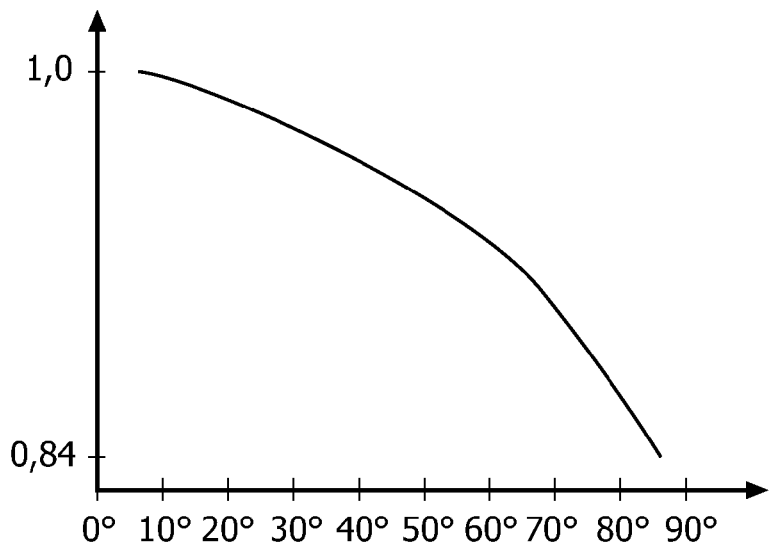
FIG. 3
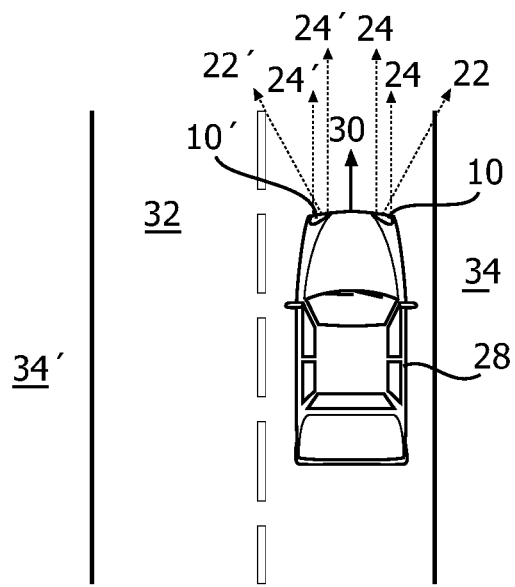
FIG. 4

VEHICLE HEADLIGHT

The present invention relates to a vehicle headlight. The present invention also relates to a vehicle comprising such a headlight.

Vehicle headlights are important in allowing a driver of the vehicle to see objects on and beside the road in dark conditions. Headlights are in principle white lights, but by changing the color temperature of the white light on specific parts of the road, advantage can be obtained. For example, bluish white light can improve the visibility of objects on the shoulder of or besides the road (such as traffic signs, pedestrians, animals, etc.). Also, for light directed more towards the axis of the road, yellowish white light is more beneficial since it is more pleasant for oncoming traffic and decreases attention on this part of the road.

One way of achieving these features is to provide the outer surface of a lamp of the headlight with suitable color coatings, as in Philips' NightGuide automotive lamps. However, such color coatings may hamper the efficiency of the headlamp, since they may absorb and/or reflect part of the light from the lamp. Another way could be to use two types of light sources, one for providing the yellow light and one for providing the blue light. However, the two different light sources may behave differently as function of time, temperature, etc., leading to inconsistent operation of the headlight over time. Also, more advanced electronics are required to drive two different light sources. Also, light sources based on different technologies may have different failure mechanisms making a headlight including several types of light sources more sensitive to failure.

It is an object of the present invention to overcome these problems, and to provide an improved headlight featuring different color temperatures.

These and other objects that will be evident from the following description are achieved by means of a headlight, and a vehicle comprising such a headlight, according to the appended claims.

According to an aspect of the invention, there is provided a headlight for a vehicle, which headlight comprises an LED including at least one LED chip adapted to emit blue light and at least one overlying converter layer for converting part of the blue light into yellow light, wherein part of the blue and yellow light forms bluish white light emitted in the direction of the LED normal and part of the blue and yellow light forms yellowish white light emitted at larger angles of departure, and means for directing at least part of the yellowish white light in a central direction of the headlight and at least part of the bluish white light in a peripheral direction of the headlight.

The invention builds on the known technique of generating white light by mixing unconverted blue light from an LED chip with converted yellow light from an overlying converter layer. The inconsistent color mixing, i.e. bluish white light and the yellowish white light, is a result of the fact that rays traveling perpendicular to the LED chip surface are less absorbed and converted to yellow than rays traveling under larger angles due to a shorter travel distance through the converter layer. Thus, the invention is based on the understanding that this inconsistent color mixing can be utilized by directing the yellowish white light in a central direction of the headlight and the bluish white light in a peripheral direction of the headlight. When implemented in a vehicle, the central direction of the headlight advantageously corresponds to the main forwards driving direction of the vehicle so that yellowish white light is directed towards the axis of the road, while the bluish white light is directed towards the shoulder of the road, for reasons set forth above. Thus, according to the present invention, a headlight with different color temperatures can be achieved using a single type of light source (i.e. the LED), allowing more consistent operation of the headlight over time and temperature. Also, relatively simple electronics can be used to drive the single light source. Also, no color filters are required.

The directing means can further be adapted to direct any unconverted blue light emitted from the side of the LED chip in the peripheral direction of the headlight, thus adding blue to the bluish white. Such unconverted blue light may for example occur in a case where the converter layer is of the same size as the LED chip, or in a case with a conversion layer being smaller than the LED chip.

The directing means can comprise at least one of reflective, refractive and diffractive elements. For example the yellowish white light emitted at larger angles can be directed by a reflector in the central direction of the headlight, while the bluish white light emitted along the LED normal is refracted by a refraction element in the peripheral side direction of the headlight.

The headlight preferably comprises a lens covering the LED. The purpose of the lens is to reduce total internal reflection in the converter layer such that the yellowish white light traveling at larger angles can be extracted to a larger extent, resulting in more inconsistent color mixing, which is advantageously utilized in the headlight according to the invention. The lens can for example be a silicone lens.

The converter layer is preferably a solid-state converter plate, such as a ceramic converter plate. Such a converter plate may be more robust and less sensitive to temperature than non-solid state conversion layers. The converter layer preferably comprises phosphors for converting blue light into yellow light.

According to another aspect of the invention, there is provided a vehicle comprising at least one headlight according to the above description. The central direction of the headlight should substantially correspond to the main forward driving direction of the vehicle. Thus, the yellowish white light is directed towards the road axis and any oncoming traffic, while the bluish white light is directed more towards the side of the vehicle, i.e. towards the shoulder of the road. The vehicle is for example a car.

These and other aspects of the present invention will now be described in more detail, with reference to the appended drawings showing a currently preferred embodiment of the invention.

FIG. 1 schematically illustrates a headlight according to an embodiment of the present invention, FIG. 2 is a detailed view of an LED of the headlight in FIG. 1, FIG. 3 is a graph showing color temperature in relation to emission angle for the LED in FIG. 2, and FIG. 4 is a top view of a vehicle comprising two headlights of the type illustrated in FIG. 1.

FIG. 1 schematically illustrates a headlight 10 according to an embodiment of the present invention. The headlight 10 comprises an LED 12, as well as a reflector 14 and a refractive element 16. The LED 12 is driven by electronics (not shown).

The LED 12 is shown in somewhat more detail in FIG. 2. Referring to FIG. 2, the LED 12 comprises an LED chip or die 18 adapted to emit blue light. The LED chip 18 is placed on a substrate 19. On top of the LED chip 18, there is provided a converter plate 20, preferably a solid-state ceramic converter plate comprising phosphors. A suitable converter plate is disclosed in for example the document US2005/0269582.

Upon operation of the LED 12, blue light emitted mainly from the top of the LED chip 18 is partly absorbed and converted by the phosphor of the overlying converter plate 20 into yellow light. Unconverted blue light and converted yellow light then mixes to white light. Also, unconverted blue light 23 may be emitted from the sides of the LED chip 18.

However, for a given thickness and phosphor concentration of the converter plate 20, a ray 22 traveling perpendicular to the surface of the LED chip 18 is less absorbed and converted into yellow than rays 24 traveling under larger angles due to a shorter travel distance through the converter plate 20. This results in inconsistent color mixing, wherein bluish white light is emitted in the direction of the LED normal and yellowish white light is emitted at larger angles of departure, typically at angles larger than 75°. To promote the inconsistent color mixing, the converter plate 20 preferably has an unstructured top surface, even though a slightly scattering converter plate also will work.

To further promote this inconsistent color mixing, a silicone lens 26 can optionally be arranged to cover the LED 12. The lens 26 reduces total internal reflection in the converter plate 20 such that the yellowish white light traveling at larger angles can be extracted to a larger extent. The correlated color temperature (y-axis) in relation to emission angle (x-axis) for such an LED 12 with a silicone lens 26 is shown in the graph in FIG. 3. Higher correlated color temperature means more bluish light. It should be noted that a transparent converter plate also further promotes the inconsistent color mixing.

Referring again to FIG. 1, this inconsistent color mixing is utilized to provide a headlamp 10 featuring different color temperatures. At least part of the yellowish white light 24 emitted at larger angles of departure from the LED 12 is directed by the reflector 14 in a central direction of the headlight 10, while at least part of the bluish white light 22 emitted along the LED normal is refracted by the refractive element 16 in a peripheral side direction of the headlight 10. In FIG. 1, the bluish white light 22 is directed towards the right side, but it can alternatively be directed in some other peripheral direction. Further, a diffractive element could be used instead of the refractive element 16. Also, alternative configurations for directing the bluish and yellowish white light will be apparent to the skilled person. Also, the unconverted blue light 23 (not shown in FIG. 1) could here be directed to the right to add to the bluish white light 22.

FIG. 4 is a top view of a vehicle 28 comprising a headlight 10 as illustrated in FIG. 1. The vehicle 28 can for example be a car or a bus or a truck. The headlight 10 is arranged such that the central direction of the headlight 10 corresponds to a main forwards driving direction 30 of the vehicle 28, whereby the yellowish white light 24 is directed towards a road 32 and any oncoming traffic. On the other hand, the bluish white light 22 is directed towards a shoulder 34 of the road 32. As explained above, bluish white light can improve the visibility of objects on the shoulder of or besides the road (such as traffic signs, pedestrians, animals, etc.), while yellowish white light for example is more pleasant for oncoming traffic. The vehicle 28 can optionally further comprise a headlight 10' being similar to the headlight 10, with yellowish white light 24' being directed towards the road 32, but with the bluish white light 22' being directed to the left, to illuminate a shoulder 34' on the opposite of the road 32. Alternatively, the headlight 10' can be a conventional white headlight, or it can be similar to the headlight 10 with the bluish white light 22' being directed to the right. These described alternative setups are adapted foremost for right-hand traffic. For left-hand traffic, they should be mirror-inverted.

The person skilled in the art realizes that the present invention by no means is limited to the preferred embodiments described above. On the contrary, many modifications and variations are possible within the scope of the appended claims. For example, even though a single LED chip and a single converter plate is shown in FIG. 2, the LED can comprise several LED chips covered by one or several converter plates. For instance, each LED chip can have its own conversion layer. Also, even though a four-wheeled vehicle having two headlights is shown above, the headlight according to the invention can likewise be used in a two-wheeled vehicle, such as a motorcycle, having a single headlight.

The invention claimed is:

1. A headlight for a vehicle, comprising:
  a light emitting diode including at least one light emitting diode chip adapted to emit blue light and at least one overlying converter layer disposed upon the light emitting diode for converting part of the blue light into yellow light, wherein part of the blue and yellow light forms bluish white light emitted in the direction of the light emitting diode normal and part of the blue and yellow light forms yellowish white light emitted at larger angles of departure from the light emitting diode normal; and
  an optical device for directing at least part of the yellowish white light in a central direction of the headlight and at least part of the bluish white light in a peripheral direction of the headlight.

2. The headlight according to claim 1, wherein the optical device is further adapted to direct any unconverted blue light emitted from the side of the light emitting diode chip in the peripheral direction of the headlight.

3. The headlight according to claim 1, wherein the optical device comprises at least one of reflective, refractive and diffractive elements.

4. The headlight according to claim 1, further comprising a lens covering the light emitting diode.

5. The headlight according to claim 1, wherein the converter layer is a solid-state converter plate.

6. The headlight according to claim 1, wherein the converter layer comprises phosphor.

7. A vehicle comprising at least one headlight according to claim 1.

8. The vehicle according to claim 7, wherein the central direction of the headlight is substantially parallel to a direction of the vehicle movement.

9. A headlight according to claim 4, wherein the lens covering the light emitting diode is a silicone lens.

10. A headlight according to claim 1, wherein the converter layer is a ceramic converter plate.

11. A headlight for a vehicle, comprising:
  a light emitting diode including at least one light emitting diode chip adapted to emit a light of a first color and at least one overlying converter layer disposed upon the light emitting diode for converting part of the light of the first color into a light of a second color, wherein part of the light of the first color and part of the light of the second color forms a first combination color emitted in the direction of the light emitting diode normal and part of the light of the first color and part of the light of the second color forms a second combination color emitted at larger angles of departure from the light emitting diode normal; and
  an optical device for directing at least part of the light of the first combination color in a central direction of the headlight and at least part of the light of the second combination color in a peripheral direction of the headlight.

12. The headlight according to claim 11, wherein the optical device is further adapted to direct any unconverted blue light emitted from the side of the light emitting diode chip in the peripheral direction of the headlight.

13. The headlight according to claim 11, wherein the optical device comprises at least one of reflective, refractive and diffractive elements.

14. A headlight according to claim 11, further comprising a lens covering the light emitting diode.

15. A headlight according to claim 11, wherein the converter layer is a solid-state converter plate.

16. A headlight according to claim 11, wherein the converter layer comprises phosphor.

17. A vehicle comprising at least one headlight according to claim 11.

18. The vehicle according to claim 17, wherein the central direction of the headlight substantially parallel to a direction of the vehicle movement.

19. A headlight according to claim 14, wherein the lens covering the light emitting diode is a silicone lens.

20. A headlight according to claim 11, wherein the converter layer is a ceramic converter plate.

* * * * *